United States Patent [19]

Keane et al.

[11] 4,429,034

[45] Jan. 31, 1984

[54] DRY FILM RESISTS

[75] Inventors: John J. Keane, Ballston Lake; Richard F. Zopf, Burnt Hills, both of N.Y.

[73] Assignee: General Electric Company, Schenectady, N.Y.

[21] Appl. No.: 367,678

[22] Filed: Apr. 12, 1982

Related U.S. Application Data

[62] Division of Ser. No. 190,029, Sep. 23, 1980, Pat. No. 4,341,859.

[51] Int. Cl.$^3$ .................................................. G03C 1/68
[52] U.S. Cl. ..................................... 430/271; 430/270; 204/159.18; 204/159.23
[58] Field of Search .............. 430/270, 271, 314, 913, 430/914, 921, 925, 280; 204/159.18, 159.23, 159.24

[56] References Cited

U.S. PATENT DOCUMENTS

| 4,026,705 | 5/1977 | Crivello et al. | 96/27 |
| 4,090,936 | 5/1978 | Barton | 204/159 |
| 4,138,255 | 2/1979 | Crivello | 96/35.1 |
| 4,161,478 | 7/1979 | Crivello | 268/327 |

OTHER PUBLICATIONS

Photoresist Materials and Processes, by W. S. DeForest (McGraw-Hill Book Co., New York, N.Y. 1975).

*Primary Examiner*—Jack P. Brammer
*Attorney, Agent, or Firm*—Donald J. Voss

[57] ABSTRACT

A resist film composed of a water-soluble polyvinyl alcohol, a water-soluble thermosetting polymethylol cross-linking agent and a polyaryl iodonium or sulfonium salt of a complex halogenide as catalyst, when irradiated with ultraviolet light and then heated, or when heated and irradiated with ultraviolet light, under a circuit mask, provides a latent image which is developable by water alone.

6 Claims, No Drawings

DRY FILM RESISTS

This application is a division of application Ser. No. 190,029, filed Sept. 23, 1980 now U.S. Pat. No. 4,341,859.

The present invention relates to aqueous suspensions suitable for the manufacture of novel resist films, the resist films themselves, the manufacture of said films from said suspensions, and the manufacture of printed circuit boards from the films.

BACKGROUND OF THE INVENTION

An important specialty of the electronics art is the manufacture of printed circuit boards by the use of photoresist coatings which permit intricate circuitry to be formed cheaply, reproducibly and accurately on a miniature scale. In a simple instance a circuit board is manufactured by coating a copper clad electrically non-conductive substrate with an organo-soluble photopolymerizable monomeric mixture, placing over the coating a transparent film mask which carries an opaque reverse print of the circuitry to be formed, exposing the assembly to ultraviolet light thereby forming a latent image in the coating, removing the mask and developing the image by rinsing the coating with an organic solvent thereby removing the unexposed portion of the coating. The copper thus uncovered is removed by an etching solution, and the copper which remains is the desired circuitry.

More recently the process has been improved by applying the photoresist composition as a dry but adhesive film under a transparent non-adherent peelable carrier film, thereby eliminating the previous need for wet-coating devices. The carrier film is peeled off when the masking film is removed, after which the latent image is developed as is described above.

Still more recently it has been found that certain resist compositions provide latent images which can be developed by aqueous media, thereby eliminating need for costly and inflammable solvents. Up to the present, development of the image with water has been a chemical one (usually based on conversion of a polyacid or a polyester to a soluble salt), and usually requires a strong aqueous alkali solution.

The present invention provides a photoresist composition which, when applied to a circuit board as a dry film and irradiated and heated under a circuit mask, provides a latent image which can be developed by water alone. No chemical reaction is involved in the development process, and no acid or alkali is needed.

The starting composition of the present invention is a homogeneous, self-sustaining emulsion or dispersion (hereinafter termed "emulsion") of coating viscosity, comprising:

(i) colloidal droplets of a solution of a polyaryl iodonium or sulfonium salt of a complex halogenide latent catalyst in a continuous aqueous phase containing (ii) a water-soluble normally solid polyvinyl alcohol as latent film-forming component, and (iii) an effective amount of a water-soluble thermosetting polymethylol compound to cross-link said polyvinyl alcohol to a water-insoluble state, the amount of said latent catalyst being sufficient to catalyze the cross-linking reaction of said polymethylol compound when said emulsion is dried and irradiated with ultraviolet light and heated. Heating can be at the same time as irradiation, or it can be subsequent in time thereto.

The resist film of the present invention comprises the solids content of the above-described emulsion is apparently dry state. The film is water-dispersible and flexible at normal room temperature. It thus comprises a homogeneous mixture of:

(i) colloidal droplets of a solution of a polyaryl iodonium or sulfonium salt of a complex halogenide latent catalyst in (ii) a water-soluble normally solid polyvinyl alcohol as film-forming component, and (iii) an effective amount of water-soluble thermosetting polymethylol compound to cross-link said polyvinyl alcohol to a water-insoluble state at elevated temperature, the amount of said latent catalyst being sufficient to catalyze the cross-linking reaction of said polymethylol compound when said emulsion is dried and irradiated with ultraviolet light at elevated temperature.

The starting emulsion of the present invention can be directly employed in the manufacture of circuit boards by coating a copper-clad electro-nonconductive substrate (a circuit board preform) with the emulsion, drying the emulsion; exposing the resulting adherent and dry film to ultraviolet light and heating the film and the substrate, exposure through a photomask carrying a reverse image of the desired circuitry. As mentioned, the irradiation and baking steps can be combined, but it is preferred to irradiate first and then to heat. By so doing the portion of the film which has been exposed to the ultraviolet light and the heat has become water-insoluble. The board can then be rinsed or sprayed with water. The unexposed portion of the resist coating is thereby removed. The underlying copper which is thereby exposed is then etched away in a separate step, and the copper which remains is the desired circuitry. The board is then finished in any conventional manner.

Principal advantages of the process are that the starting emulsion is non-inflammable and can be diluted with water, and development of the latent image in the resist coating after exposure of the coating to ultraviolet light is accomplished by water without need for an organic solvent or performance of a chemical reaction.

When the emulsion is processed into a dry film resist on a peelable non-adhesive carrier film and the resulting assembly is used to provide the resist coating in the manufacture of circuit boards according to the present invention, in preferred embodiments the procedure possesses the following important advantages:

1. The resist film, before exposure to ultraviolet light and heat, is water-dispersible, which facilitates the usual necessary cleanup steps.

2. After the film has been exposed under ultraviolet light and heated with formation of a latent image, development of the latent image is performed by the action of water alone. Development of the image does not involve any chemical reaction and does not require any organic liquid or aqueous acid or base solution.

3. The exposed resist is water-insoluble but can be stripped from the board by the action of common organic liquids. On completion of the etching and stripping steps, sharp and clear circuitry is produced.

4. The starting aqueous emulsion and the dry resist film prepared therefrom are stable sufficiently long at room temperature for most industrial purposes. The dry resist film is stable for over a month when stored below about 5° C.

5. The resist film is flexible and can be applied to circuit boards in customary manner. The resist film adheres well to copper when applied, and adheres more strongly after ultraviolet irradiation at elevated temperature.

The starting emulsions of the present invention can be prepared by forming a mixture of a latent catalyst for the cross-linking reaction, a polyvinyl alcohol (or mixture of polyvinyl alcohols), and a polymethylol cross-linking component (or mixture of such components) together with water, and then subjecting the resulting mixture to intensive shear agitation to form a colloidal dispersion of the catalyst in an aqueous solution of the other two components. The foregoing steps are preferably performed at as low a temperature as is convenient so as to minimize premature formation of cross-linkages.

The amount of water which is present in the mixture is predetermined to provide an emulsion of appropriate viscosity in view of the intended method of its application. To increase the viscosity of the emulsion without removing water, a hydrophilic thickener (for example, carboxymethylcellulose) can be added, or the mixture can be subjected to a mild pre-polymerization by a short period of moderate heating. Acetone can be added to decrease the viscosity of the emulsion.

The polyvinyl alcohol component can be polyvinyl alcohol itself, or it can be any water-soluble vinyl polymer (or mixture of such polymers) which contains a sufficient proportion of hydroxyl substituents to permit it to be cross-linked to a water-insoluble form by a water-soluble polymethylol compound. The water-soluble hydrolysis products of polyvinyl acetate which contain at least about 60 mol percent of vinyl alcohol units are suitable for the purpose. Polyvinyl acetate hydrolysates which are composed of vinyl alcohol and vinyl acetate units in 95:5 to 85:15 molar ratio are preferred because they are readily water-soluble and because they are compatible with a large number of the common water-soluble thermosetting polymethylol cross-linking agents and are readily available at low cost.

The emulsions possess better shelf life when the polyvinyl alcohol component is of low molecular weight, and consequently polyvinyl alcohol components having molecular weights in the range of 5,000 to 50,000 are preferred.

A variety of other polyvinyl alcohols can be used, for example the hydrolysis products of polymers containing 90 mol percent of vinyl acetate units and 10 mol percent of acrylonitrile, styrene, 2-vinyl-N-methylpyridine or vinyl chloride units.

Suitable polymethylol cross-linking agents for use in the compositions of the present invention are those which are water-soluble and which contain a sufficient proportion of methylol substituents to thermoset to a water-insoluble state when heated at temperatures up to 200° C. They include trimethylolmelamine, hexamethylolmelamine, hexa(methoxymethyl)melamine, dimethylolurea, dimethylolguanidine, trimethylolformoguanamine, and poly(N-methylol)acrylamide. Under cross-linking conditions methoxymethyl substituents decompose and provide methylol substituents. The resole condensate (a phenol-formaldehyde condensate prepared by the use of formaldehyde in excess) is the preferred polymethylol compound because this compound cross-links rapidly with vinyl alcohol units under catalysis at moderately elevated temperatures, is very water-soluble, and is readily available at low cost.

Suitable catalysts for use in the present invention are those which become active and accelerate the cross-linking reaction only when they are irradiated with ultraviolet light. The preferred catalysts of this type are the class known generally as aryliodonium and sulfonium salts, and more particularly as the polyaryl iodonium or sulfonium salts of complex halogenides. A large number of members of this class and methods for the preparation thereof are disclosed in Barton, U.S. Pat. Nos. 4,099,936 and 4,026,705; Crivello, U.S. Pat. No. 4,138,255; Crivello et al, U.S. Pat. No. 4,161,478, Belgian Pat. No. 845,746 and certain references cited in said patents, all of which patents are hereby incorporated by reference herein. Suitable members include the following compounds.

Diphenyliodonium tetrafluoroborate
Phenyl-4-methylphenyliodonium tetrafluoroborate
Diphenyliodonium hexafluorophosphate
3,5-Dimethylpyrazolyl-4-phenyliodonium hexafluorophosphate
Diphenyliodonium hexafluoroantimonate
Diphenyliodonium hexafluoroarsenate
Diphenyliodonium hexaflorophosphate
Triphenylsulfonium tetrafluoroborate
Triphenylsulfonium hexafluorophosphate
Triphenylsulfonium hexafluoroarsenate
Triphenylsulfonium hexafluoroantimonate
Dimethylphenylsulfonium hexafluorophosphate
Methyl(N-methylphenothiazinyl)sulfonium hexafluoroantimonate
Di(methoxynaphthyl)methylsulfonium tetrafluoroborate
Diphenylnaphthylsulfonium hexafluoroarsenate
Thiophenoxydiphenylsulfonium tetrafluoroborate
Thiophenoxydiphenylsulfonium hexafluorophosphate
Thiophenoxydiphenylsulfonium hexafluoroarsenate
Thiophenoxydiphenylsulfonium hexafluoroantimonate,
and the like.

These catalysts are substantially inert under ordinary visible light and in the dark, but become active when irradiated with actinic light and particularly with ultraviolet light having a wavelength in the range of 200 nm to 350 nm. The catalysts are substantially insoluble in water but are soluble in several inert organic liquids, for example acetone, methylene chloride and methyl formate. These solvents are more or less soluble in water and so release the catalyst in finely divided form. It is preferred to add the catalyst as a concentrated solution in a solvent which is water-insoluble because this permits the catalyst to be in molecularly dispersed state during the irradiation step. A preferred solvent of this type is propylene carbonate, formed by reaction of propylene glycol with phosgene and therefore having the theoretical formula:

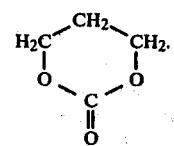

Concentrations of catalyst in the solvent up to the saturation point are suitable, and in most instances it is readily feasible to prepare solutions of the catalyst of 25% to 50% catalyst concentration by weight in the solvent.

If desired, the catalyst can be added in finely powdered or colloidal state prepared by grinding the catalyst in a colloid mill with or without a grinding aid.

The starting emulsion can contain one or more than one of other compounds which are customarily present in the surface-coating emulsions, for example one or more dyes, pigments and perfume for identification purposes, a sensitizer to promote the action of the catalyst, a thickening or a thinning agent, and a volatile organic liquid to facilitate drying of the emulsion.

If desired, the starting emulsion can be coated directly upon a circuit board by any of the methods described below. A useful resist film coating on the board is formed by drying the coating in the absence of ultraviolet light at a temperature below the point at which the components cross-link.

Preferably, however, the emulsion is formed into a dry resist film which can be applied to the circuit board in dry state. For this purpose the starting emulsion is cast on a non-adhesive carrier film and dried thereon. Suitable carrier films are the poly(haloethylene) films represented by poly(tetrafluoroethylene) and poly(dichlorodifluoroethylene) known as Teflon, Kel-F and Tedlar. The emulsion easily wets these films and forms a uniform coating thereon.

The emulsion can be applied to the carrier film by any convenient method, for example by spray, by roller coater, and by knife coater. A sufficient amount of the emulsion is applied so that the resist film, in final apparently dry form, is between 0.2 mil and 2 mils thick. This range is not critical, and for certain purposes it may be desirable to produce thinner or thicker films, and these are within the scope of the invention.

The emulsion should be dried in such manner that no more than a negligible amount of cross-linking takes place and so that the film is apparently dry and is free from pin holes. Satisfactory results in these directions are obtained when the emulsion is dried at temperatures up to about 100° C. in the dark. The emulsion is so thin and the drying rate is so fast that very little cross-linking occurs. A superior product is obtained, however, when the emulsion is dried at room temperature under vacuum.

The dry resist film-carrier film combination can be cut into any desired shape and stacked, or formed into rolls with or without a peelable protective film over the exposed side of the resist film.

The resist film thus prepared remains useable for short periods of time (two days to several weeks) when stored at room temperature, the precise length of time in any instance depending chiefly on the particular cross-linking agent which is used and the ratio of the number of vinyl alcohol units to the number of methylol substituents in the cross-linking agent. The period of usefulness is extended when the film is maintained substantially below room temperature, and at temperatures below about 5° C. the film remains stable for at least about a month. At the temperature of solid carbon dioxide the film appears to remain useful indefinitely.

Circuit boards are manufactured according to the present invention by:

(i) covering a copper-clad electrically non-conducting substrate with a photoresist film as is described above;

(ii) projecting on the film with ultraviolet light the design of the circuitry to be formed and simultaneously therewith or thereafter elevating to the cross linking temperature until the polyvinyl alcohol in the irradiated portion of said film has cross-linked to water-insoluble state;

(iii) washing said film with water thereby removing the unexposed portion of said resist film and exposing the copper therebelow; and (iv) etching away the copper thereby exposed, thereby forming the desired circuitry.

The substrate is any circuit board of the type to which dry resist film has been applied in the past. The thickness of the resist film does not appear to be critical, and satisfactory circuitry has been obtained by the use of films as thin as 0.2 mil and as thick as 2 mils. The film is applied in any convenient way.

The design of the desired circuitry can be projected on the film in any convenient way. It may be projected photographically, or through a transparent mask placed over the film carrying a negative of the circuitry to be formed. It is usually satisfactory to terminate the radiation and heating when the exposed portion of the resist film has become insoluble in sold water, but if desired, the irradiation and heating can be continued until this portion of the film has reached the level of cross-linking where it is insoluble in hot water as this improves the adhesion of the resist coating over the copper which is to become the desired circuitry. The precise duration of the irradiation and heating step or steps varies from instance to instance depending on the particular polyvinyl alcohol and cross-linking component used, the efficiency of the catalyst, the intensity of the radiation, and the heating temperature, and therefore is most conveniently determined in any instance by laboratory trial. The carrier film is removed before or after the baking step, as may be the more convenient.

The washing step can be accomplished by rinsing the irradiated board in a body of water, by use of a spray, or by brushing the board with water. The temperature of water may be as high as desired, up to the point where loosening of the exposed film occurs.

The etching step is performed in any customary manner. The cross-linked resist film is strongly resistant to most etching solutions. A suitable solution is formed by dissolving two pounds of ammonium persulfate in a gallon of water; other etchants are disclosed in the book "Photoresist Materials and Processes", by Williams S. DeForest (McGraw-Hill Book Co., New York, N.Y., 1975), which is hereby incorporated by reference.

On completion of the etching step the board is finished in customary manner which may include a touch-up step, post-baking, stripping of the residual resist coating, application of solder, and attachment of electrical components.

The invention is further illustrated by the examples which follow. These examples are best embodiments of the invention and are not to be construed in limitation thereof.

EXAMPLE 1

The following illustrates the preparation of the starting emulsion of the present invention and the preparation of a water-dispersible, flexible, apparently dry photoresist film therefrom, also according to the present invention.

Into a beaker are placed with stirring (i) 7.5 parts by weight of a 50% by weight solution of triphenylsulfonium hexafluoroantimonate in propylene carbonate, (ii) 320 parts by weight of a 25% solution in distilled water of a solid, cold-water soluble low molecular weight polyvinyl alcohol (Elvanol 51-04) composed of vinyl alcohol and vinyl acetate units in 89:11 molar ratio, and (iii) 80 parts of a 50% by weight aqueous solution of a B-stage resole phenol-formaldehyde condensate having a pH of 7.2, a viscosity of 30 cp. at 20° C. and a stroke cure at 150° C. of 212 seconds. The resulting mixture is formed into a stable emulsion by passage through a colloid mill.

A portion of the emulsion is formed into films 0.3 mil, 0.6 mil and 1.3 mil in thickness (dry basis) by casting the emulsion on a non-adherent film (Tedlar) as carrier film and drying the emulsion thereon at room temperature under vacuum. The resulting composite films are clear, transparent and flexible, and the resist coating component is tacky.

EXAMPLE 2

A number of films from Example 1 can be stored at dry ice temperature for periods of 6 months or more. Upon warming to room temperature these films can be used according to the invention.

EXAMPLE 3

The procedure of Example 1 is repeated except that the amount of the phenol-formaldehyde condensation product solution is increased to 160 parts and the amount of the catalyst solution is increased to 10 parts. Similar films are obtained.

EXAMPLE 4

The procedure of Example 1 is repeated except that the amount of the phenol-formaldehyde condensation solution is increased to 320 parts and the amount of the catalyst solution is increased to 14.4 parts. Similar films are obtained.

EXAMPLE 5

The following illustrates the manufacture of printed circuit boards according to the present invention.

The dry resist films of Examples 1, 3 and 4 (supported on the carrier film) are applied manually to squares of freshly-cleaned circuit board (a copper-clad flame-resistant fiberglass-filled epoxy resin laminate 1/16" thick). The resist coatings adhere well to the copper cladding when laminated with mild heat of 40° C. Over the carrier film of each assembly is placed a transparent masking film, the clear areas of which represent the circuitry to be formed. Ultraviolet light of 350 nm wavelength is projected on the assemblies for a single pass in the apparatus shown in the table below, then the boards are heated (baked) at a temperature of 150° C. for the specified times in seconds thereby forming latent images of the desired circuitry in the resist films. The boards are then cooled to room temperature, and the masks are removed and the carrier film peeled off. The latent images are developed by rinsing the boards with water at room temperature, after which the boards are allowed to dry at room temperature.

Results are as follows.

| Ex. No. | % Phenol Condn. Prod.[1] | Passes Under U-V[2] | Bake Time at 150° C. sec. | Cold Water Rinse | Quality of Image Resist. to Cold H$_2$O | Sharpness |
|---|---|---|---|---|---|---|
| 1 | 33 | 1 | 90 | Good | Good | Good |
| 3 | 50 | 1 | 90 | " | " | " |
| 4 | 67 | 1 | 75 | " | " | " |

[1]Wt. of phenol-formaldehyde cond. prod. on wt. of the polyvinyl alcohol.
[2]Exposure to U-V radiation (10 ft./min. under two 300-watt per linear inch MPWV lamps; Fusion Systems Decoray II apparatus).
[3]After removal of the exposed copper by etching solution, and stripping of the overlying resist.

More rapid development of the image with no loss in sharpness occurs when the rinse water is warm.

EXAMPLE 6

The procedure of Example 3 is repeated except that the phenol-formaldehyde solution is replaced by 160 parts of a 50% by weight aqueous solution of hexamethoxymethylmelamine (Cymel 301, American Cyanamid Co.). Similar films are obtained.

EXAMPLE 7

The procedure of Example 3 is repeated except that the phenol-formaldehyde solution is replaced by 64 parts of a 50% by weight solution of dimethylolurea, and the weight of the catalyst solution is increased to 13.44 parts. Similar films are obtained.

EXAMPLE 8

The procedure of Example 6 is repeated except that the hexamethoxymethylmelamine is Cymel 303 of the American Cyanamid Co. A similar film is obtained.

EXAMPLE 9

The procedure of Example 5 is repeated except that the films used are the films of Examples 6–8, the duration of the exposure to the radiation is 7 minutes, and the temperature to which the board is raised after irradiation is 170° C. The unexposed portions of the resist coating are readily removed by warm water, the exposed portions of the film are well cured, and after etching of the copper and stripping of the residual resist coating the circuitry is good.

Many variations will suggest themselves to those skilled in this art in light of the above, detailed description. For example, instead of triphenylsulfonium hexafluoroantimonate there can be used triphenylsulfononium tetrafluoroborate, triphenylsulfonium hexafluorophosphate, triphenylsulfonium hexafluoroarsenate, diphenyliodonium tetrafluoroborate, diphenyliodonium hexafluorophosphate, diphenyliodonium hexafluoroarsenate, diphenyliodonium hexafluoroantimonate, thiophenoxydiphenylsulfonium tetrafluoroborate, thiophenoxydiphenylsulfonium hexafluorophosphate, thiophenoxydiphenylsulfonium hexafluoroarsenate or thiophenoxydiphenylsulfonium hexafluoroantimonate.

All such obvious variations are within the full intended scope of the appended claims.

We claim:

1. A water-dispersible flexible apparently dry but tacky photoresist film comprising a homogeneous mixture of:
   (i) colloidal droplets of a solution in a solvent comprising acetone, methyl chloride, methylformate or propylene carbonate of a polyaryliodonium or sulfonium salt of a complex halogenide latent catalyst dispersed in a continuous aqueous phase containing, (ii) a water-soluble normally solid polyvinyl alcohol as film-forming component, and (iii) an effective amount of a water-soluble thermosetting polymethylol compound to cross-link said polyvinyl alcohol to water-insoluble state at elevated temperature therefor, the amount of said latent catalyst being sufficient to catalyze the cross-linking action of said polymethylol compound when said emulsion is dried and irradiated with ultraviolet light and heated simultaneously with or subsequent to said irradiation.

2. A photoresist film according to claim 1 between 0.2 mil and 2 mils in thickness.

3. A photoresist film according to claim 1, supported on a non-adhesive peelable carrier film.

4. A photoresist film according to claim 3, wherein the carrier film is a poly (polyhaloethylene) film.

5. A photoresist film according to claim 4, wherein the carrier film is poly(dichlorodifluoroethylene).

6. A photoresist film according to claim 3, wherein the carrier film is transparent to ultraviolet light.

* * * * *